(12) United States Patent
Yeh

(10) Patent No.: US 9,978,638 B2
(45) Date of Patent: May 22, 2018

(54) METAL TRENCH DE-NOISE STRUCTURE AND METHOD FOR FORMING THE SAME

(71) Applicant: Realtek Semiconductor Corp., HsinChu (TW)

(72) Inventor: Ta-Hsun Yeh, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days. days.

(21) Appl. No.: 14/453,605

(22) Filed: Aug. 6, 2014

(65) Prior Publication Data

US 2015/0061083 A1 Mar. 5, 2015

(30) Foreign Application Priority Data

Sep. 3, 2013 (TW) ............................... 102131716 A

(51) Int. Cl.
| | |
|---|---|
| *H01L 29/94* | (2006.01) |
| *H01L 27/06* | (2006.01) |
| *H01L 29/66* | (2006.01) |
| *H01L 21/768* | (2006.01) |
| *H01L 21/74* | (2006.01) |

(52) U.S. Cl.
CPC ...... *H01L 21/76807* (2013.01); *H01L 21/743* (2013.01); *H01L 21/76898* (2013.01); *H01L 27/0629* (2013.01); *H01L 29/66181* (2013.01); *H01L 29/945* (2013.01); *H01L 2223/6616* (2013.01)

(58) Field of Classification Search
None
See application file for complete search history.

(56) References Cited

U.S. PATENT DOCUMENTS

| | | | | | |
|---|---|---|---|---|---|
| 4,470,062 | A | * | 9/1984 | Muramatsu | 257/513 |
| 5,196,920 | A | * | 3/1993 | Kumamoto et al. | 257/798 |
| 5,475,255 | A | * | 12/1995 | Joardar et al. | 257/547 |
| 5,814,889 | A | * | 9/1998 | Gaul | 257/773 |
| 6,472,723 | B1 | * | 10/2002 | Jarstad et al. | 257/659 |
| 6,486,017 | B1 | | 11/2002 | Verma | |
| 6,638,844 | B1 | | 10/2003 | Verma | |
| 6,642,583 | B2 | * | 11/2003 | Jimbo et al. | 257/372 |
| 6,740,953 | B2 | * | 5/2004 | Tanabe | 257/499 |
| 7,030,455 | B2 | * | 4/2006 | Gamand et al. | 257/508 |
| 7,030,466 | B1 | * | 4/2006 | Hsuan | 257/621 |
| 7,427,803 | B2 | * | 9/2008 | Chao et al. | 257/659 |
| 7,701,057 | B1 | * | 4/2010 | Rahman et al. | 257/750 |
| 7,833,876 | B2 | * | 11/2010 | Akagi et al. | 438/430 |
| 8,169,059 | B2 | * | 5/2012 | Barth et al. | 257/659 |
| 8,232,625 | B2 | * | 7/2012 | Voldman | 257/621 |
| 8,294,203 | B2 | * | 10/2012 | Van Noort et al. | 257/328 |

(Continued)

FOREIGN PATENT DOCUMENTS

| | | |
|---|---|---|
| CN | 1499904 A | 5/2004 |
| CN | 101226898 A | 7/2008 |

(Continued)

*Primary Examiner* — Hoang-Quan Ho
(74) *Attorney, Agent, or Firm* — Winston Hsu

(57) ABSTRACT

A metal trench de-noise structure includes a trench disposed in a substrate, an insulating layer deposited on the sidewall of the trench, an Inter-Layer Dielectric layer covering the substrate and the insulating layer, and a metal layer penetrating the Inter-Layer Dielectric layer to fill up the trench. The metal layer may be grounded or floating.

8 Claims, 11 Drawing Sheets

(56) References Cited

U.S. PATENT DOCUMENTS

| | | | |
|---|---|---|---|
| 8,450,836 B2* | 5/2013 | Uemura et al. | 257/659 |
| 8,546,953 B2* | 10/2013 | Horng et al. | 257/774 |
| 8,889,548 B2* | 11/2014 | Barth et al. | 438/667 |
| 8,916,471 B1* | 12/2014 | Yang et al. | 438/667 |
| 9,029,988 B2* | 5/2015 | Cheng et al. | 257/621 |
| 2002/0020862 A1* | 2/2002 | Livengood | H01L 21/76898 257/276 |
| 2002/0140049 A1* | 10/2002 | Tanabe | H01L 21/763 257/520 |
| 2004/0085013 A1 | 5/2004 | Han et al. | |
| 2008/0073747 A1* | 3/2008 | Chao et al. | 257/520 |
| 2010/0078777 A1* | 4/2010 | Barth et al. | 257/659 |
| 2010/0140749 A1* | 6/2010 | Kuo | 257/621 |
| 2010/0148289 A1 | 6/2010 | McCarten | |
| 2010/0225005 A1* | 9/2010 | Nishio et al. | 257/774 |
| 2010/0244187 A1* | 9/2010 | Voldman | 257/531 |
| 2011/0147884 A1* | 6/2011 | Van Noort et al. | 257/508 |
| 2012/0080802 A1* | 4/2012 | Cheng et al. | 257/774 |
| 2012/0199916 A1* | 8/2012 | Oyu | 257/401 |
| 2013/0009317 A1* | 1/2013 | Hsieh et al. | 257/774 |
| 2013/0147057 A1* | 6/2013 | Horng et al. | 257/774 |
| 2013/0181349 A1* | 7/2013 | Koyama et al. | 257/741 |
| 2013/0264676 A1* | 10/2013 | Yang et al. | 257/508 |
| 2014/0061936 A1* | 3/2014 | Moroz et al. | 257/774 |
| 2014/0210058 A1* | 7/2014 | Lee et al. | 257/657 |
| 2014/0246757 A1* | 9/2014 | Daley et al. | 257/621 |
| 2014/0312491 A1* | 10/2014 | Jin et al. | 257/737 |
| 2015/0061151 A1* | 3/2015 | Kuo et al. | 257/774 |

FOREIGN PATENT DOCUMENTS

| | | |
|---|---|---|
| CN | 101286519 A | 10/2008 |
| CN | 102246302 A | 11/2011 |
| CN | 102751230 A | 10/2012 |
| TW | 201304104 | 1/2013 |

* cited by examiner

METAL TRENCH DE-NOISE STRUCTURE AND METHOD FOR FORMING THE SAME

CROSS REFERENCE TO RELATED APPLICATION

This application claims the benefit of Taiwanese Application 102131716, filed Sep. 3, 2013.

BACKGROUND OF THE INVENTION

1. Field of the Invention

The present invention generally relates to a metal trench de-noise structure. In particular, the present invention is directed to a deep metal trench de-noise structure, to avoid sensitive signal region interfering with coupling noise in the substrate.

2. Description of the Prior Art

Generally speaking, as shown in FIG. 11, semiconductor elements are usually various semiconductor elements 40 disposed on the element region 41 of the substrate 10. Optionally, the element region 41 may include various electronic elements. For example, various adjacent element regions 41 include electronic elements generating different types of signals. For instance, various adjacent element regions 41 may be a digital circuit element region 42, a radio frequency (RF) circuit element region 43, or an analog circuit element region 44. Because element regions 40 of different functions generate different types of signals, these signals may couple one another by means of the substrate, to be the noise of other signals.

Generally speaking, element regions 40 of different functions tolerate noise differently. For example, a digital circuit element region 42 generates digital signals. On one hand, the quality of a digital signal is indifferent to a considerable amount of noise which the digital signal itself carries. On the other hand, either a pure digital signal itself or its associated noise is likely to become the noise of other kinds of more sensitive signal types. In other words, the digital signal itself is indifferent to noise, but it could be the source of noise to other types of signals which are more sensitive to noise.

As far as the analogue circuit element region 44 or the RF circuit element region 43 is concerned, they are less tolerant to noise than a digital circuit element region 42, in particular different RF circuit element regions 43 may also interfere with one another. For example, it is possible that different RF circuit element regions 43 of the same frequency may even interfere with one another when they are too close to each other. Or, when different RF circuit element regions 43 of high/low frequencies RF type regions 43 are too close to each other, mutual interference between different type regions thus happens. Different analog circuit element regions 44 may interfere with one another, too. Considering the increasing element density on chips and different element regions are getting closer and closer to each other, they intensify the interference of noise. Therefore, a new way is still needed to minimize the noise as much as possible or to even eliminate the noise or the interference among different element regions through the substrate. Preferably, the solution is also compatible with the current semiconductor manufacturing process.

SUMMARY OF THE INVENTION

In view of this, the present invention therefore proposes a metal trench de-noise structure which is used to suppress the interference of coupling noise in the substrate. The metal trench de-noise structure of the present invention has floating or grounded metal piles deeply rooted in the substrate, to quickly shield or drain an interference of coupling noise in the substrate, for example noise from a digital region, so that a signal in a more sensitive region, such as a signal from an analog region, are less easily coupled or interfered.

The present invention in a first aspect proposes a metal trench de-noise structure. The metal trench de-noise structure of the present invention includes a substrate, a trench, an insulating layer, an inter-layer dielectric layer, and a metal layer. The trench is disposed in the substrate. The insulating layer is disposed on the sidewall of the trench. The inter-layer dielectric layer covers the substrate and the insulating layer. The metal layer is disposed on the substrate and penetrates the inter-layer dielectric layer to fill up the trench. The metal layer is either grounded or floating to quickly suck the coupling noise in the substrate, or further to shield noise from other regions, to avoid the coupling hetero signals in the substrate interfering with signals from other regions.

The present invention in a second aspect proposes a method of forming a metal trench de-noise structure. First, a substrate covered by an interlayer dielectric layer is provided. Second, a dual damascene process is carried out. The dual damascene process may be as follows. A damascene opening and a trench are formed so that the damascene opening is disposed in the interlayer dielectric layer, and the trench penetrates the interlayer dielectric layer and goes into the substrate. Second, an insulating layer is formed on the inner wall of the trench. Then, the damascene opening and the trench are simultaneously filled up with a metal so that the damascene opening becomes a part of a dual damascene structure, and the trench turns into a metal trench de-noise structure. The metal trench de-noise structure is floating.

In one embodiment of the present invention, the method of the present invention further includes to electrically connect the metal trench de-noise structure to a metal routing so that the metal trench de-noise structure is grounded.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a metal trench de-noise structure and a method for forming the metal trench de-noise structure. The metal layer in the metal trench de-noise structure goes deeply in the substrate to form floating or grounded metal piles. Such metal piles are able to shield or to quickly suck the interference of coupling noise in the substrate. This ensures the purity and cleanness of individual signals.

Figure 1:
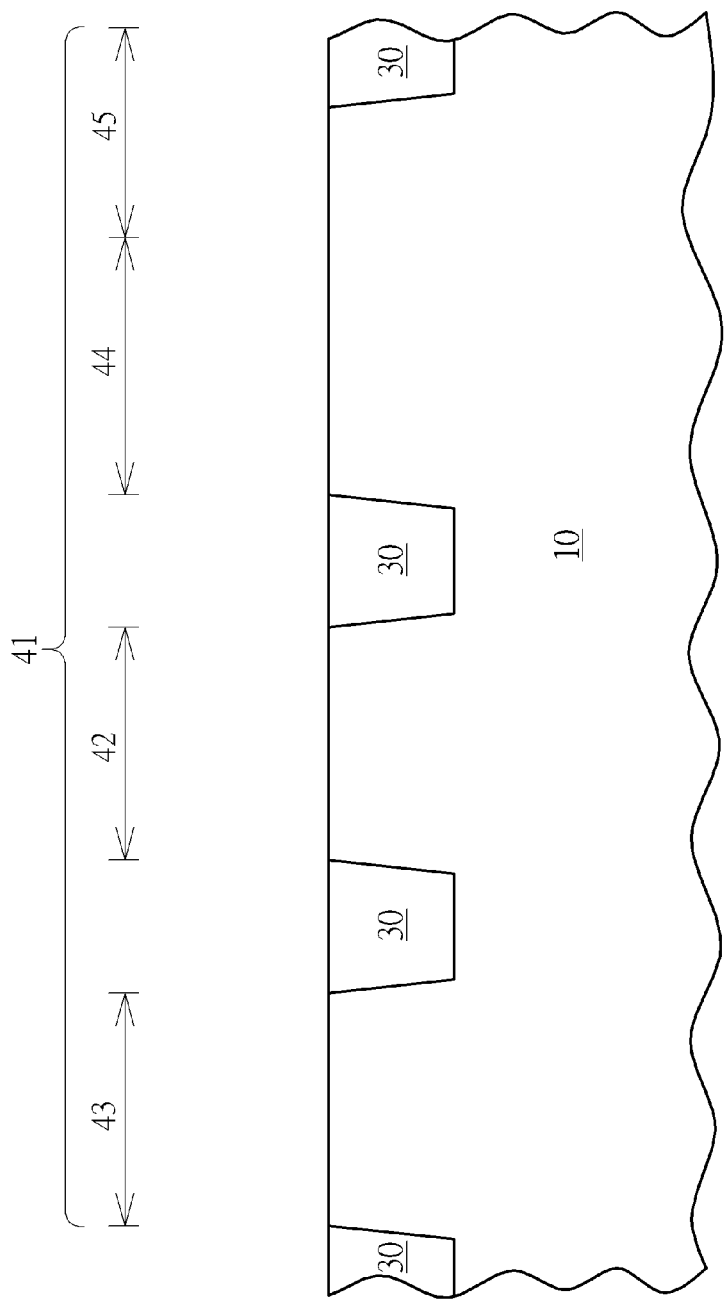
FIG. 1 to FIG. 7 illustrate the method for forming a metal trench de-noise structure of the present invention.

First, the present invention provides a method of forming a metal trench de-noise structure. FIG. 1 to FIG. 7 illustrates the method for forming a metal trench de-noise structure of the present invention. First, as shown in FIG. 1, a substrate 10 is provided. The substrate 10 may be a semiconductor substrate, for example a silicon substrate, an epitaxial silicon substrate, a silicon germanium substrate, a silicon carbide substrate or a silicon-on-insulator (SOI) substrate, but it is not limited to this. The substrate 10 is usually grounded. In addition, in the substrate 10 there may be several pre-formed shallow trench isolations 30 use as an electric isolation. The shallow trench isolations 30 are used to segregate semiconductor elements 40 which are adjacent to one another. The shallow trench isolations 30 may be formed as follows. First, some trenches (not shown) for use in shallow trench isolations are formed by etching the substrate 10 with the help of a hard mask (not shown). Then, the previously formed trenches are filed with an insulating material (not shown), and the excess insulating material is removed by a planarization process. The resultant shallow trench isolations 30 are obtained when the hard mask (not shown) is removed.

Figure 2:
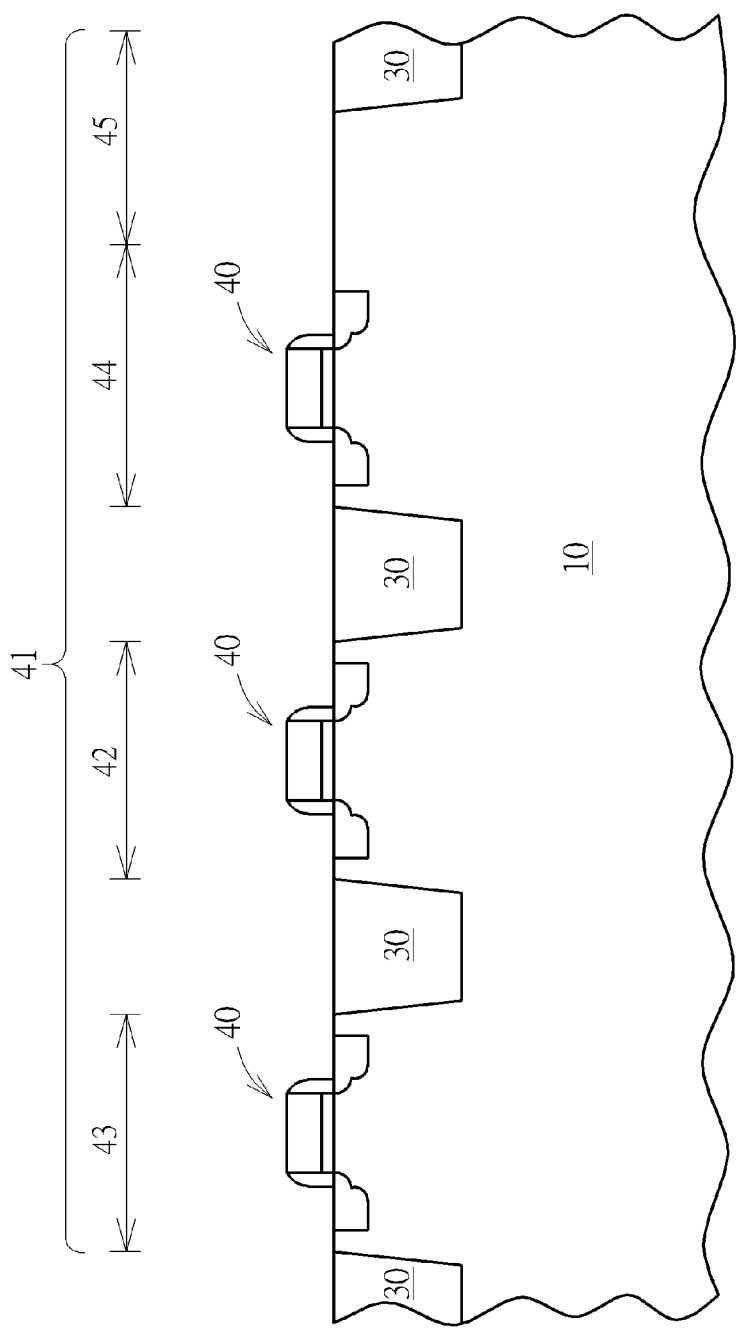

Then, as shown in FIG. 2, after the shallow trench isolation 30 in the substrate 10 is completed, optional semiconductor elements 40 are formed in the substrate 10. The semiconductor element 40 usually has a source (not labeled), a drain (not labeled) and a gate (not labeled). The semiconductor elements 40 are usually various semiconductor elements 40 disposed in different element regions 41. Optionally, the element regions include various electronic elements, preferably, different element regions 41 include electronic elements which generates different types of signals. For example, different element regions 41 may be a digital circuit element region 42, a RF circuit element region 43, an analog circuit element region 44 or a dummy element region 45.

Figure 3:
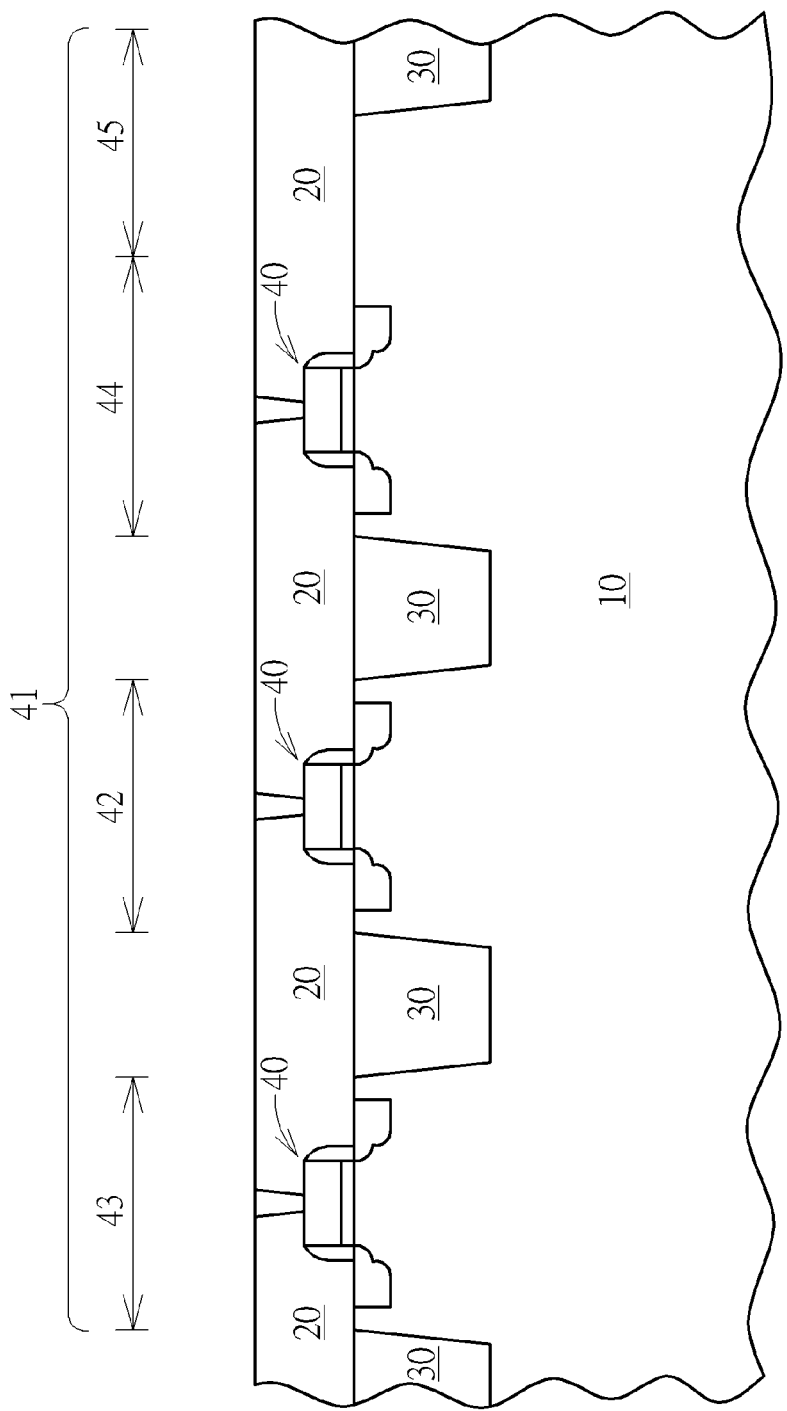

Then, after the completion of semiconductor elements 41 in different element regions 40, as shown in FIG. 3, an interlayer dielectric layer 20 is used to cover the substrate 10 and the finished semiconductor elements 40 so that the substrate 10 becomes a substrate 10 to be covered by the interlayer dielectric layer 20. The interlayer dielectric layer 20 is usually an insulating material, such as a silicon-oxide-containing insulating material (for example, USG or FSG).

Figure 4:
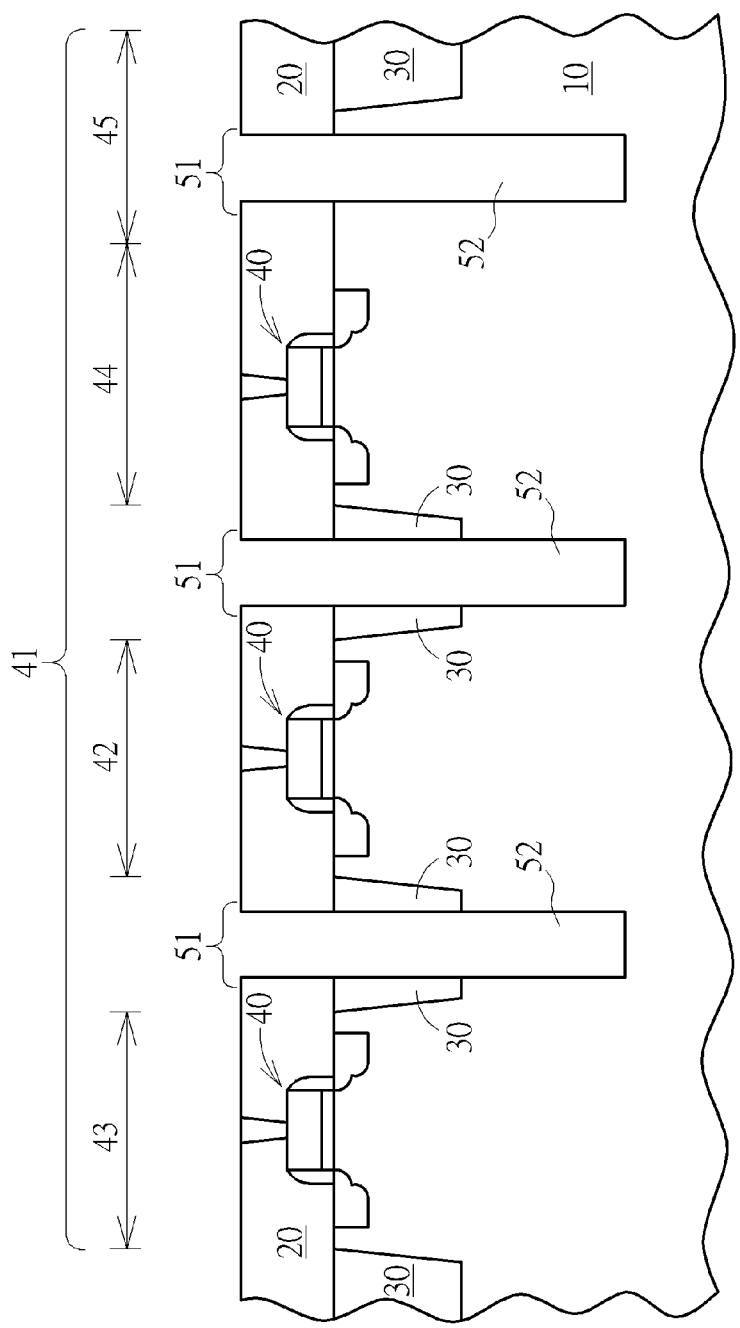

Next, as shown in FIG. 4, a dual damascene process is carried out in the interlayer dielectric layer 20 and in the substrate 10. This dual damascene process forms metal piles which go deeply in the substrate 10 to completely shield or quickly suck the coupling noise in the substrate 10. First, as shown in FIG. 4, the needed damascene opening 51 and the trench 52 are formed so that the damascene opening 51 is disposed in the interlayer dielectric layer 20, and the trench 52 penetrates the interlayer dielectric layer 20 and goes into the substrate 10. Conventional procedures may be used to form the damascene opening 51 and the trench 52. For example, a photoresist (not shown) along with a lithography and an etching process may be used to form a damascene opening 51 and the trench 52.

Preferably, the trench 52 in the substrate 10 is as deep as possible. In one embodiment of the present invention, the trench 52 is deeper than at least one semiconductor element 40 in the element region 41. For example, the trench 52 is deeper than any of the semiconductor element 40 in the element region 41. Or, the depth of the trench is at least greater than 5 µm. Preferably, the depth of the trench may be about 30 µm-100 µm. In addition, the width of the trench 52 may be about 3 µm-10 µm. Generally speaking, the depth of the trench 52 is dependent upon the width of the trench 52. For example, the larger the width of the trench 52 is, the deeper of the trench 52 could be. Preferably, the depth of the trench 52 is 10 times greater than the width.

Figure 5:
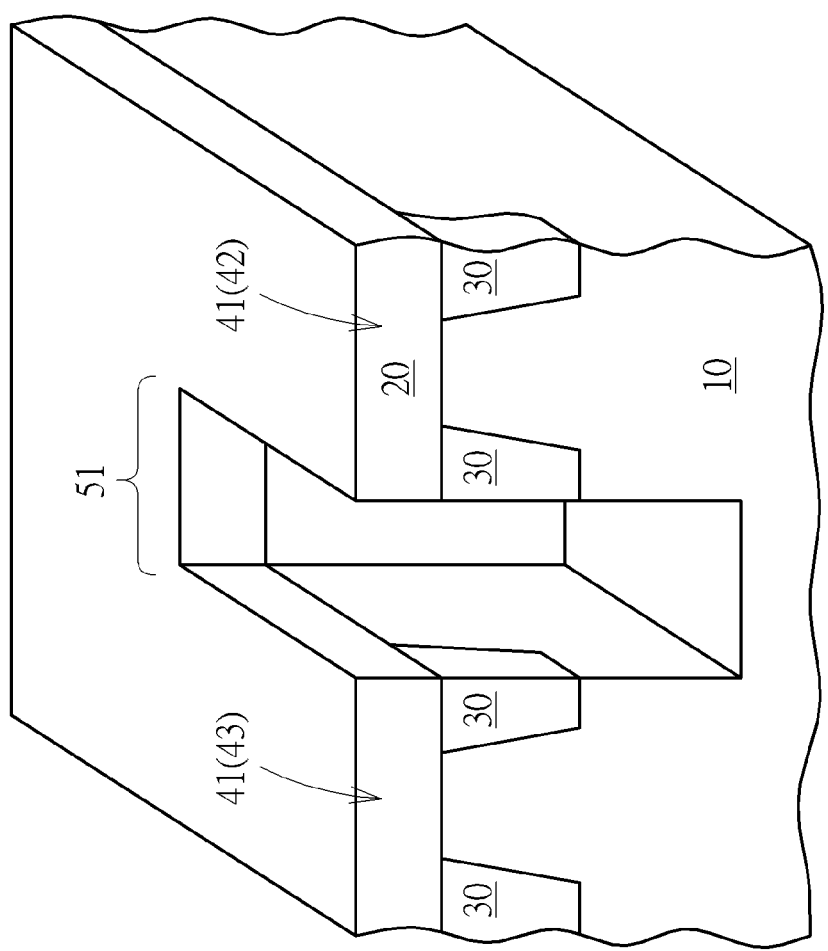
Figure 6:
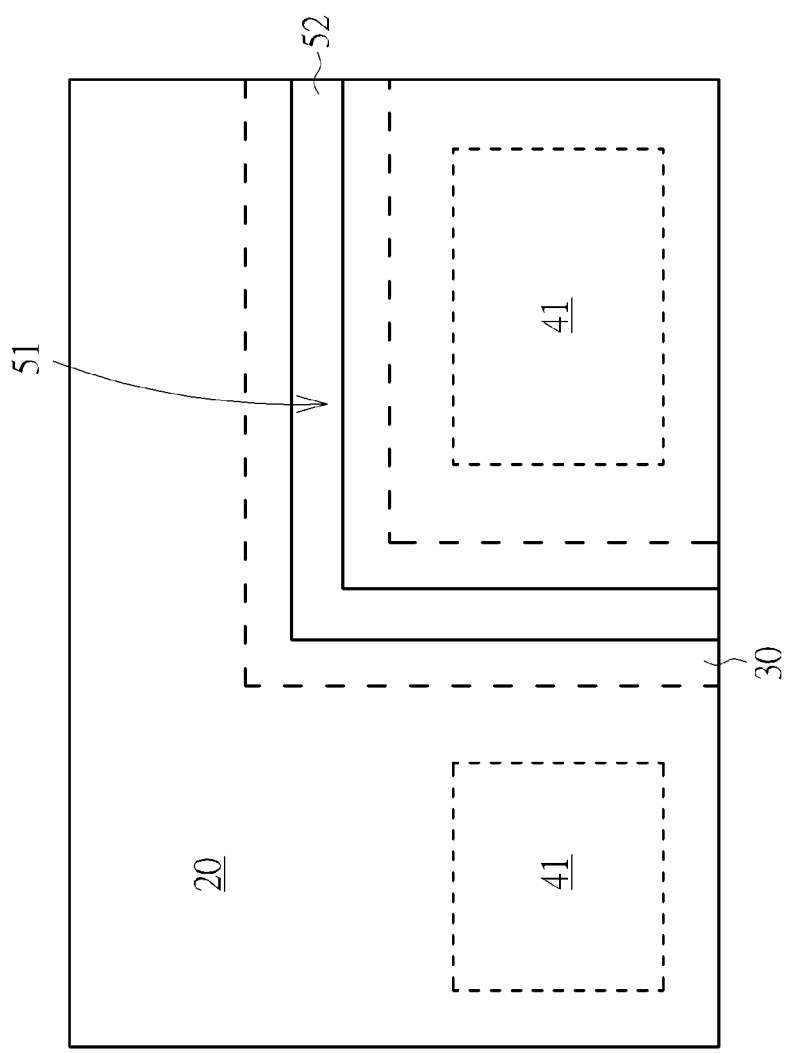

In addition, in another embodiment of the present invention, as shown in FIG. 5, the trench 52 may possibly penetrate any of the shallow trench isolation 30, for example the shallow trench isolation 30 between the element regions 41, and surrounded by the shallow trench isolation 30. Preferably, there are more sensitive element regions 41 adjacent to this shallow trench isolation 30, such as a radio frequency circuit element region 43 or an analog circuit element region 44. In still another embodiment of the present invention, as shown in FIG. 6, the trench 52 may conformally penetrate the shallow trench isolation 30, and is surrounded by the shallow trench isolation 30.

Further, optionally, as shown in FIG. 4, the trench 52 may also be disposed in a dummy element region 45 and is surrounded by a shallow trench isolation 30. Due to the current requirements of the element density of the semiconductors in the substrate 10 the higher the better, the normal element regions may not always have enough space to accommodate the metal trench de-noise structure of the present invention. Accordingly, the present invention may possibly arrange the trench 52 in the dummy region 45, for example the dummy region 45 for the dummy patterns, to save the area for accommodating the semiconductor elements 40 on the substrate 10.

Figure 7:
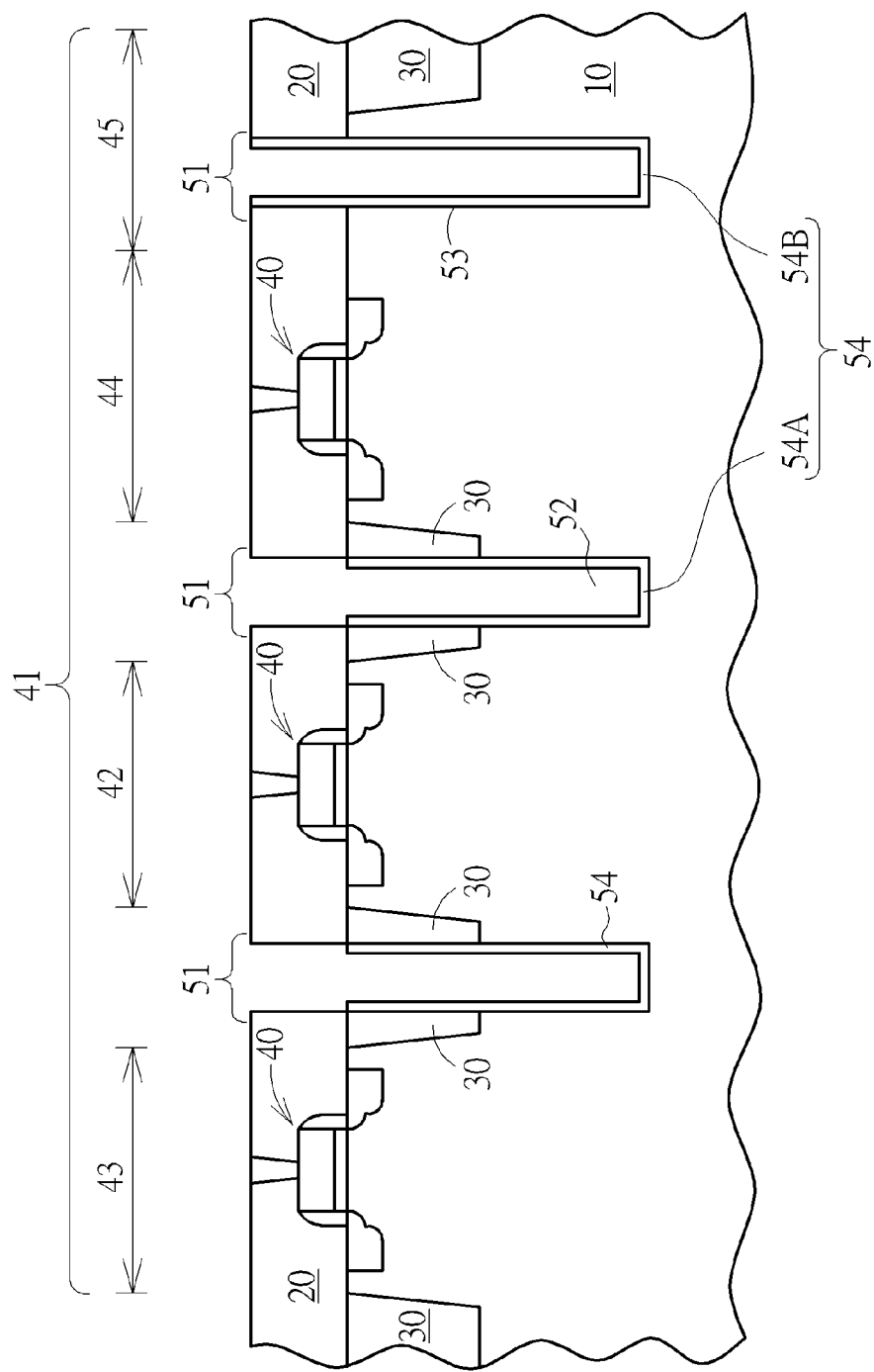

Afterwards, as shown in FIG. 7, an insulating layer 54 is formed on the inner wall 53 of the trench 52. The insulating layer 54 may be any insulating material which is compatible with the substrate 10, for example silicon oxide, silicon nitride, and various high dielectric constant insulating layers, and may have different shapes. For example, optionally the silicon-containing substrate 10 may be oxidized to obtain an insulating layer 54A on the inner wall 53 of the trench 52. Alternatively, a deposition method may be used, such as a plasma enhanced chemical vapor deposition (PECVD), to obtain an insulating layer 54B on the inner wall 53 of the trench 52. However, both the insulating layer 54A and the insulating layer 54B are only an example of the insulating layer 54.

Figure 8:
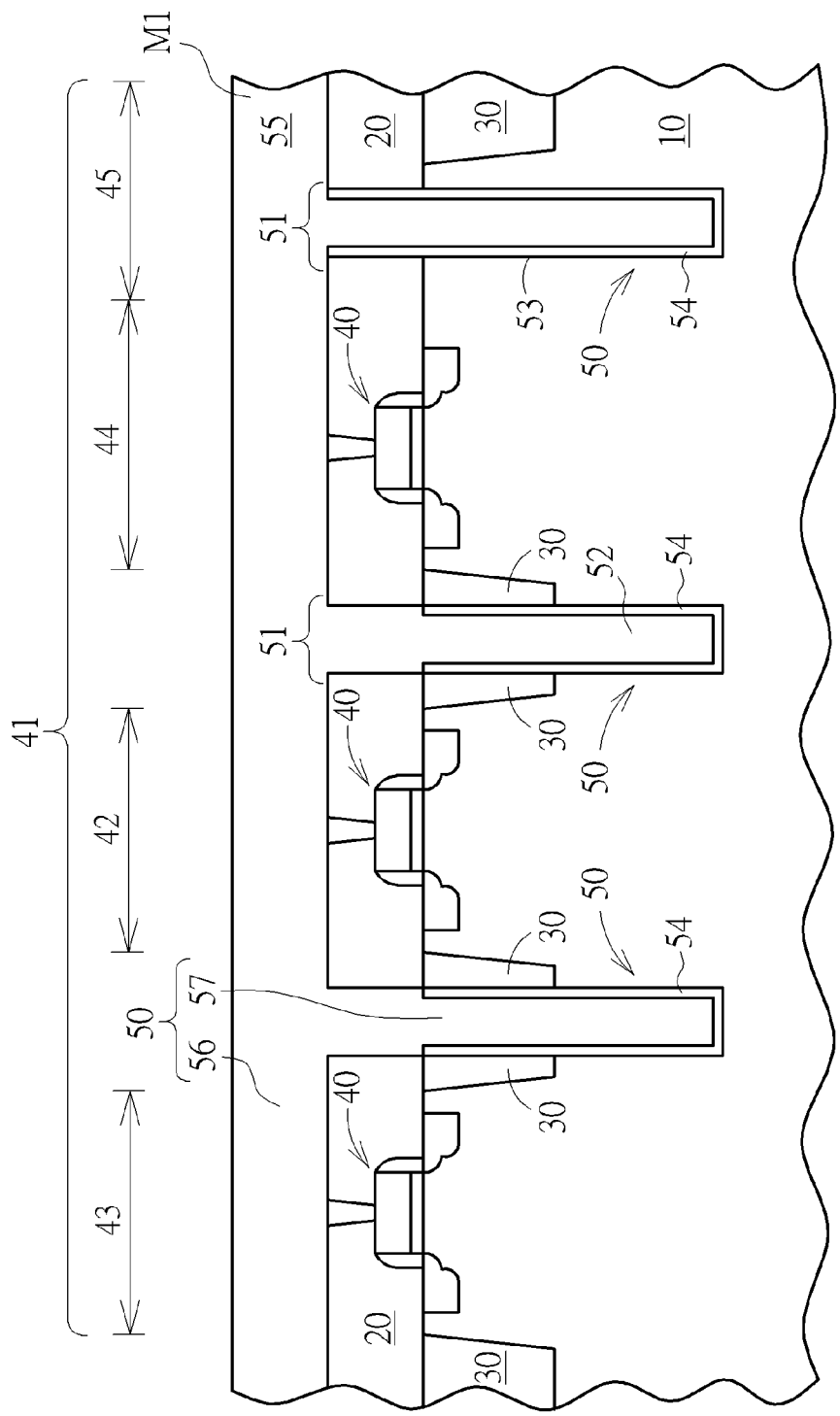
FIG. 8 illustrates the metal trench de-noise structure and the first inter-metal connection layer is integrally formed.

Then, as shown in FIG. 8, the metal layer 55 fills the trench 52 and the damascene opening 51 at the same time so that the damascene opening 51, the trench 52 and the metal layer 55 together form a metal trench de-noise structure 50 with a lateral part 56 and a vertical part 57. The metal layer 55 may be part of the first inter-metal connection layer (M1), and may be any metal, preferably by copper, tungsten, or aluminum. A conductive metal layer 55 is suitable for sucking the noise from at least one element region 41. The metal trench de-noise structure 50 is the metal piles in the substrate 10 to quickly shield or drain the coupling noise in the substrate 10. At this time, as shown in FIG. 8, the metal trench de-noise structure 50 and the first inter-metal connection layer (M1) may be formed at the same time, which means that the metal trench de-noise structure 50 and the first inter-metal connection layer (M1) may be integrally formed. If the first inter-metal connection layer (M1) is not electrically connected to an external circuit or an electrical potential, the metal layer 55 is not electrically connected to the external circuit either, so the metal trench de-noise structure 50 is in a floating state.

Figure 9:
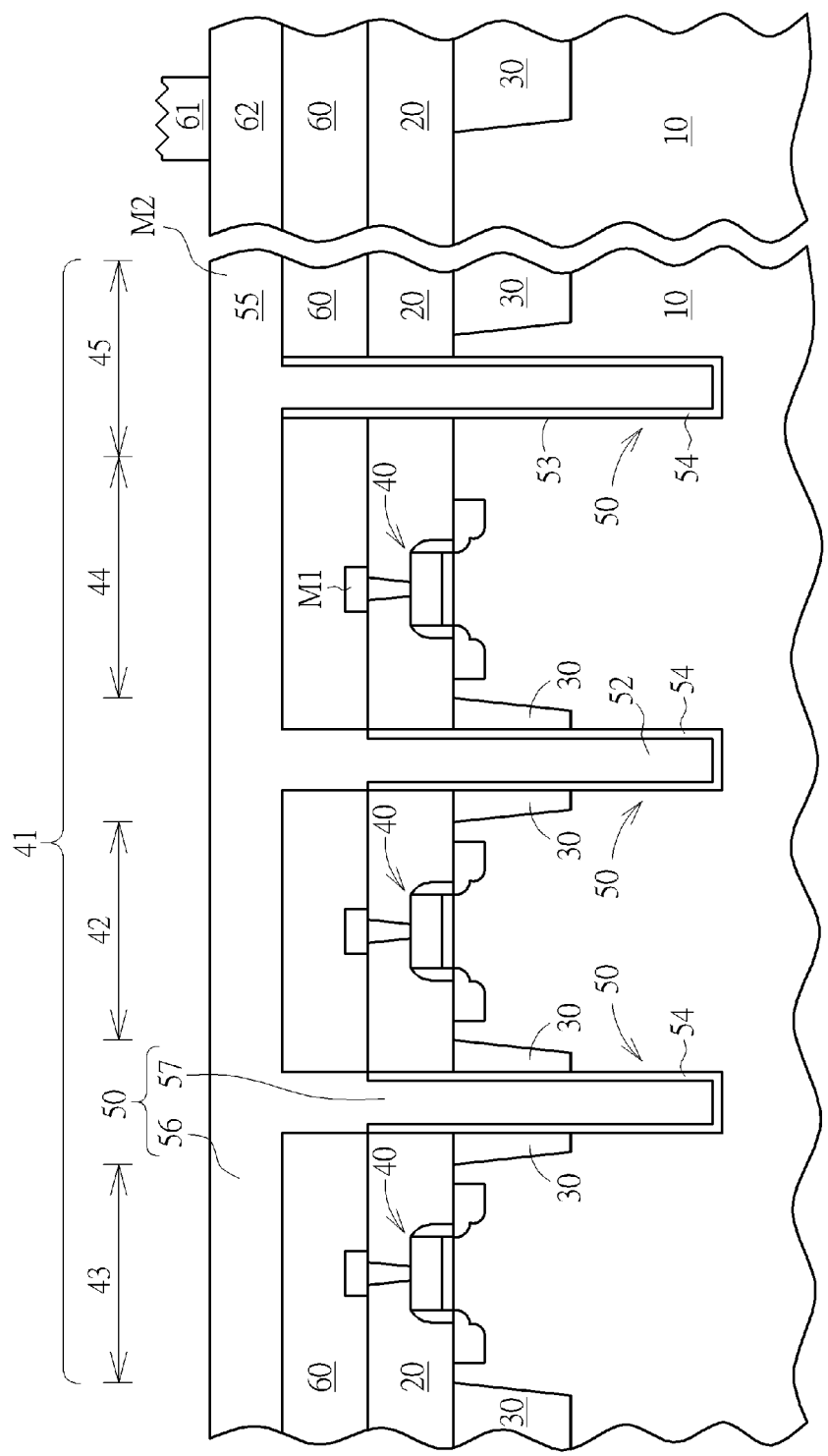
FIG. 9 illustrates the metal trench de-noise structure and the second inter-metal connection layer is integrally formed.

Or, as shown in FIG. 9, after the completion of the interlayer dielectric layer 20 the damascene process is not carried out or alternatively, the inter-metal dielectric layer 60 is formed on the interlayer dielectric layer 20 before the step of the dual damascene process between the inter-metal dielectric layer 60 and the substrate 10. At this moment, the inter-metal dielectric layer 60 is disposed on the interlayer dielectric layer 20 to cover the interlayer dielectric layer 20. The inter-metal dielectric layer 60 is usually an insulating material, such as a silicon-oxide-containing insulating material (USG or FSG). In such a way, the dual damascene process may also form the damascene opening 51 and the trench 52, so that the damascene opening 51 is disposed in the inter-metal dielectric layer 60, and the trench 52 penetrates the inter-metal dielectric layer 60 and the interlayer dielectric layer 20 goes into the substrate 10. Conventional methods may be used to form the damascene opening and the trench. For example, a photoresist (not shown) along with a lithography process and an etching process may be used to form the damascene openings and the trenches.

If the aforesaid dual damascene process is carried out in the inter-metal dielectric layer 60 and the dielectric substrate 10, the metal trench de-noise structure 50 and the second inter-metal connection layer (M2) may be formed at the same time, which means that the metal trench de-noise structure 50 and the second inter-metal connection layer (M2) are integrally formed. The second inter-metal connection layer (M2) is usually electrically connected to a metal routing 61 or to an outer circuit 62, so the metal layer 55 is also electrically connected to a metal routing 61 or to an outer circuit 62, preferably the metal trench de-noise structure 50 is in a grounded state.

Figure 10:
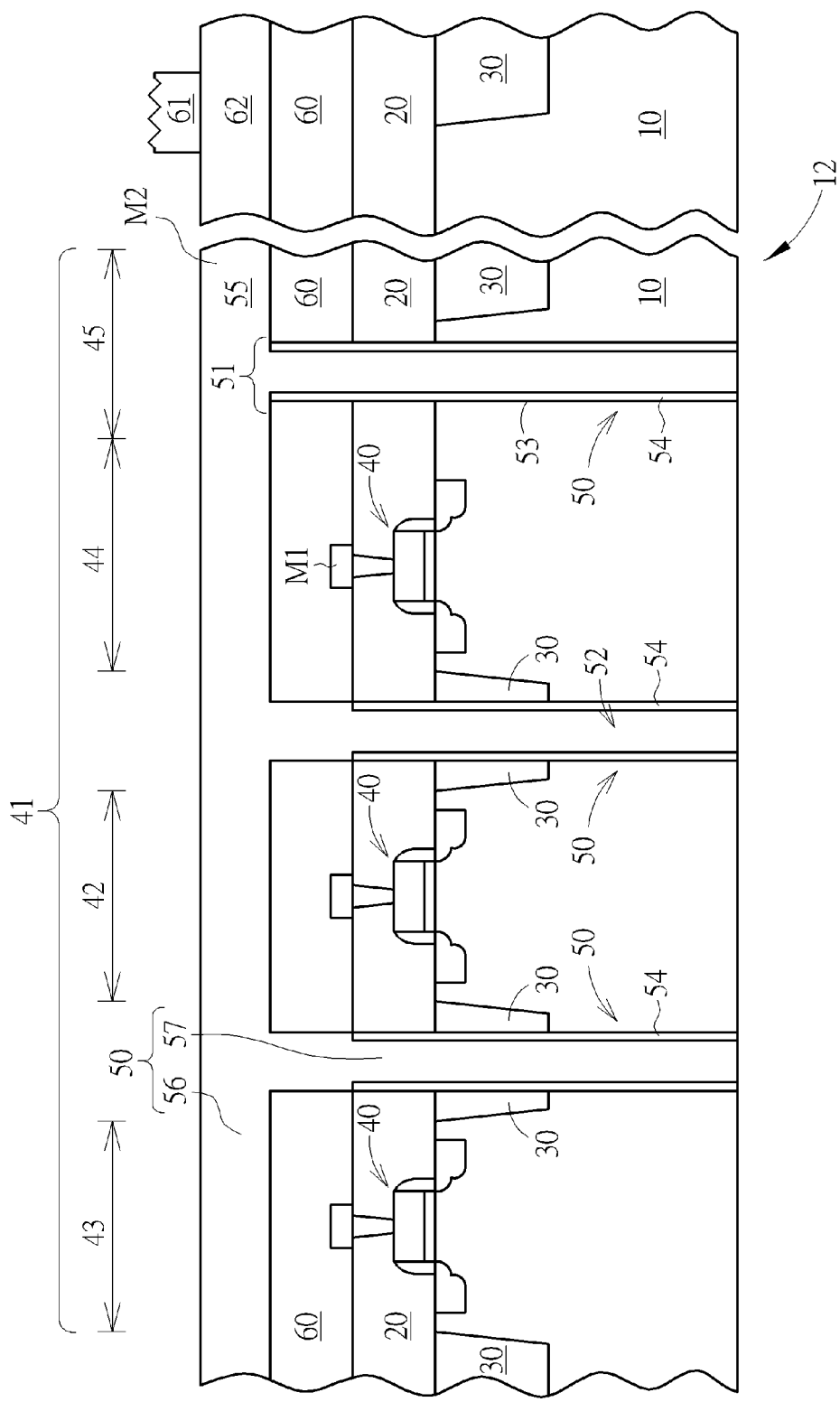
FIG. 10 illustrates the metal trench de-noise structure is further converted into a through-silicon via structure (TSV).
Figure 11:
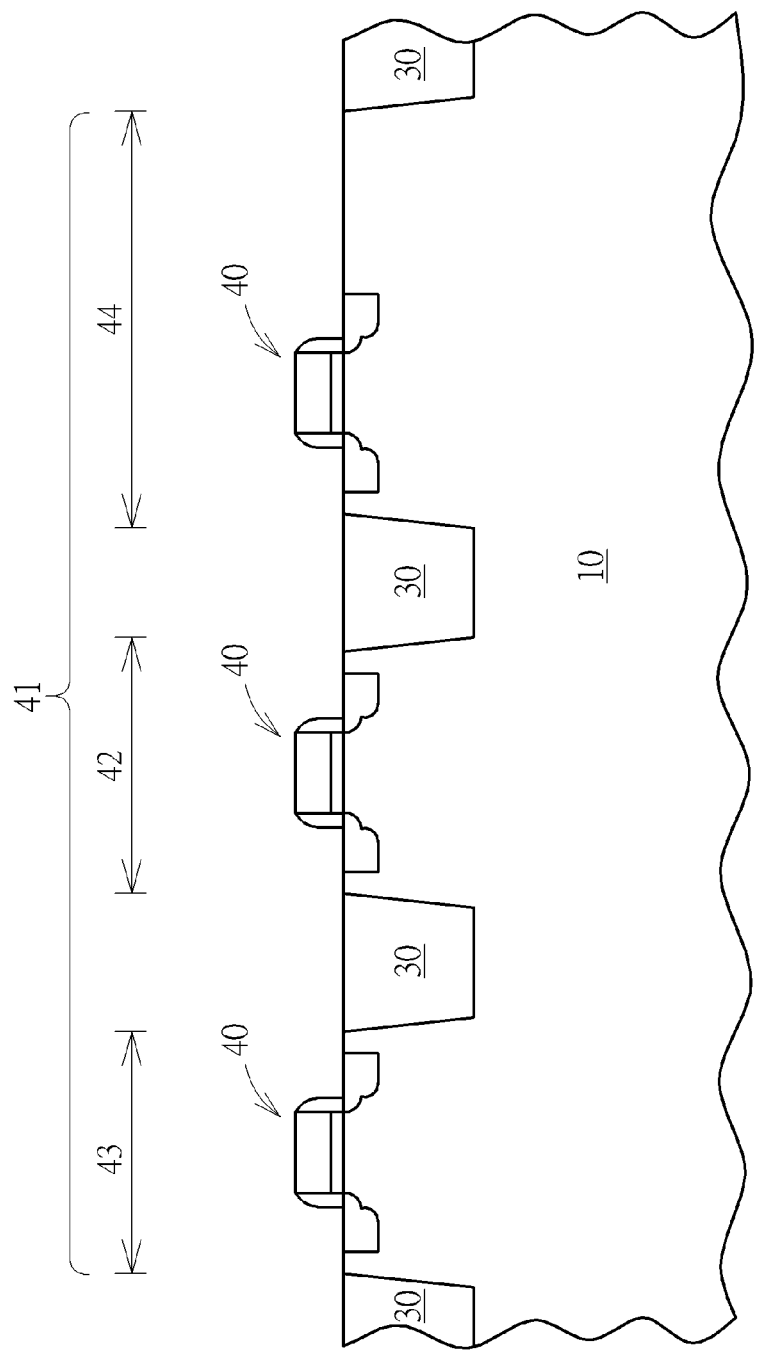
FIG. 11 illustrates semiconductor elements in prior art.

In one embodiment of the present invention, the metal trench de-noise structure 50 may be further converted into a through-silicon via structure (TSV). As shown in FIG. 10, the damascene process is followed by a thinning process on the substrate 10, to thin the substrate 10 from the back side 11 so that the trench 52 becomes the via which penetrates the substrate 10. When the bottom of the metal trench de-noise structure 50 is exposed on the back side 12 of the substrate, the metal trench de-noise structure 50 is converted into a TSV structure.

After the above steps, a metal trench de-noise structure 50 is the result of the process of the present invention. Please refer to FIG. 8, FIG. 9 or FIG. 10, the metal trench de-noise structure 50 of the present invention includes an element region 40 disposed in the substrate 10, a trench 52, an insulating layer 54, a metal layer 55, and an inter-layer dielectric layer 20 disposed on the substrate 10. The substrate 10 may be a semiconductor substrate, for example a silicon substrate, an epitaxial silicon substrate, a silicon germanium substrate, a silicon carbide substrate or a silicon-on-insulator (SOI) substrate, but it is not limited to this.

The metal trench de-noise structure 50 disposed in the substrate 10 of the present invention may be additionally surrounded by a shallow trench isolation 30. Optionally, the metal trench de-noise structure 50 may penetrate any shallow trench isolation 30, for example penetrate the shallow trench isolation 30 between the element regions 41, and is surrounded by this shallow trench isolation 30. Preferably, there are more sensitive element regions 40 adjacent to this shallow trench isolation 30, such as a RF circuit element region 43 and an analog circuit element region 44. In another embodiment of the present invention, as shown in FIG. 6, the trench 52 may conformally penetrate the shallow trench isolation 30, and is surrounded by the shallow trench isolation 30. In still another embodiment of the present invention, as shown in FIG. 9, the metal trench de-noise structure 50 may be disposed in a dummy region 45, for example in a dummy pattern, in order to save the area of the substrate 10. It is surrounded by the shallow trench isolation 30.

The element region 41 of the present invention may include different semiconductor elements 40, so that the shallow trench isolation 30 surrounds at least one the element region 41 of the semiconductor element 40. Optionally, the element regions 41 include various electronic elements; preferably, different element regions 41 include electronic elements which generate different types of signals. For example, different element regions 41 may be a digital circuit element region 42, a RF circuit element region 43, an analog circuit element region 44 or a dummy element region 45. Because element regions 41 of different functions generate different types of signals, these signals may be coupled to one another, or become the noise of other signals. The metal trench de-noise structure 50 of the present invention is able to reduce them as much as possible, or further to eliminate the mutual coupling or the interference among element regions 40.

The trench 52 in the metal trench de-noise structure 50 of the present invention goes into the substrate 10 as deep as possible, even penetrates the substrate 10 to become a via. The interlayer dielectric layer 20 covers the insulating layer 54 and the substrate 10, but exposes the trench 52. In one embodiment of the present invention, the trench 52 is deeper than at least one semiconductor element 40 in the element region 41. For example, the trench 52 is deeper than any of the semiconductor element 40 in the element region 41. Or, the depth of the trench is at least greater than 5 μm. Preferably, the depth of the trench may be about 30 μm-100 μm. In addition, the width of the trench 52 may be about 3 μm-10 μm. Generally speaking, the depth of the trench 52 is dependent upon the width of the trench 52. For example, the larger the width of the trench 52 is, the deeper of the trench 52 could be. Preferably, the depth of the trench 52 is about 10 times greater than the width. A deeper trench 52 is more capable of reducing or to eliminating the mutual coupling or the interference among different element regions 40 by way of the substrate 10.

When the trench 52 in the metal trench de-noise structure 50 of the present invention penetrates the substrate 10 to be a via, the metal trench de-noise structure 50 becomes a TSV. In other words, as shown in FIG. 10, the present invention may also take advantage of the conventional TSV structure, preferably, a TSV structure integrally formed along with the second inter-metal connection layer (M2) or with the first inter-metal connection layer (M1) to serve as the metal trench de-noise structure 50 of the present invention.

The insulating layer 54 in the metal trench de-noise structure 50 of the present invention serves as an insulating material between the metal layer 55 and the substrate 10. The insulating layer 54 may be any insulating material which is compatible with the substrate 10, for example silicon oxide, and may have different shapes. For example, optionally the silicon-containing substrate 10 may be oxidized to obtain an insulating layer 54A on the inner wall 53 of the trench 52. Alternatively, a deposition method may be used, such as a plasma enhanced chemical vapor deposition (PECVD), to obtain an insulating layer 54B on the inner wall 53 of the trench 52. However, both the insulating layer 54A and the insulating layer 54B are only an example of the insulating layer 54. The metal layer 55 may be any metal, preferably copper, tungsten, or aluminum.

The metal trench de-noise structure 50 of the present invention may merely penetrate the interlayer dielectric layer 20 and the substrate 10, or further penetrate the inter-metal dielectric layer 60 on the interlayer dielectric layer 20. If the metal trench de-noise structure 50 of the present invention merely penetrates the interlayer dielectric layer 20 and the substrate 10, as shown in FIG. 8, the metal layer 55 in the metal trench de-noise structure 50 and in the first inter-metal connection layer (M1) are formed at the same time. In other words, the metal layer 55 in the metal trench de-noise structure 50 are formed integrally along with the first inter-metal connection layer (M1). If the first inter-metal connection layer (M1) is not electrically connected to an external circuit or an electrical potential, the metal layer 55 is not electrically connected to the external circuit either, so the metal trench de-noise structure 50 is in a floating state.

If the metal trench de-noise structure 50 of the present invention further penetrates the inter-metal dielectric layer 60, as shown in FIG. 9, the metal trench de-noise structure 50 and the second inter-metal connection layer (M2) may be formed at the same time, which means that the metal trench de-noise structure 50 and the second inter-metal connection layer (M2) are integrally formed. The second inter-metal connection layer (M2) is usually electrically connected to a metal routing 61 or to an external circuit 62, so the metal layer 55 is also electrically connected to a metal routing 61 or to an outer circuit 62, preferably the metal trench de-noise structure 50 is in a grounded state. In another aspect, a grounded state is better than a floating state to cope with a large amount of noise or coupling.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal trench de-noise structure, comprising:
    a substrate;
    a trench disposed in said substrate;
    an insulating layer disposed on the sidewall of said trench;
    an inter-layer dielectric layer covering said substrate and said insulating layer; and
    a metal layer with a lateral part disposed on said substrate and with three vertical parts penetrating said inter-layer dielectric layer to fill up said trench, wherein said metal layer is either grounded or floating, and
wherein a semiconductor element is disposed between every two of the vertical parts which are adjacent to each other, said substrate comprises at least one element region adjacent to said trench and a shallow trench isolation to surround at least said element region, and said trench penetrates said shallow trench isolation and surrounded by said shallow trench isolation.

2. The metal trench de-noise structure of claim 1, further comprising:
    an inter-metal dielectric layer disposed on said interlayer dielectric layer to cover said interlayer dielectric layer, wherein said metal layer is disposed in said inter-metal dielectric layer, and penetrates said interlayer dielectric layer.

3. The metal trench de-noise structure of claim 1, wherein at least one said element region comprises a digital circuit element region, an analog circuit element region, a dummy element region and a radio frequency circuit element region.

4. The metal trench de-noise structure of claim 3, wherein the depth of said trench is greater than 5 μm.

5. The metal trench de-noise structure of claim 3, wherein said metal layer drains noise from at least one said element region.

6. The metal trench de-noise structure of claim 3, wherein said trench is disposed in said dummy element region, and surrounded by said shallow trench isolation.

7. The metal trench de-noise structure of claim 1, wherein said trench conformally penetrates said shallow trench isolation and surrounded by said shallow trench isolation.

8. The metal trench de-noise structure of claim 1, wherein said trench penetrates said substrate to be a through-silicon via (TSV).

\* \* \* \* \*